US005783952A

United States Patent [19]
Kazazian

[11] Patent Number: 5,783,952
[45] Date of Patent: Jul. 21, 1998

[54] CLOCK FEEDTHROUGH REDUCTION SYSTEM FOR SWITCHED CURRENT MEMORY CELLS

[75] Inventor: Jean-Jacques Kazazian, Trets, France

[73] Assignee: Atmel Corporation, San Jose, Calif.

[21] Appl. No.: 714,376

[22] Filed: Sep. 16, 1996

[51] Int. Cl.$^6$ .............................. G11C 27/02; G05F 3/16
[52] U.S. Cl. ................................................. 327/94; 327/91
[58] Field of Search ........................... 327/94, 91, 543, 327/538; 323/321, 311

[56] References Cited

U.S. PATENT DOCUMENTS

| | | | |
|---|---|---|---|
| 4,937,469 | 6/1990 | Larson et al. | 327/108 |
| 4,958,123 | 9/1990 | Hughes | 323/316 |
| 5,023,489 | 6/1991 | Macbeth | 327/345 |
| 5,059,832 | 10/1991 | Hughes | 327/336 |
| 5,109,169 | 4/1992 | Hughes | 327/337 |
| 5,179,301 | 1/1993 | Hughes | 327/335 |
| 5,296,752 | 3/1994 | Groeneveld et al. | 327/91 |
| 5,349,245 | 9/1994 | Hughes et al. | 327/94 |
| 5,666,303 | 9/1997 | Hughes et al. | 365/45 |
| 5,714,894 | 2/1998 | Redman-White et al. | 327/94 |

OTHER PUBLICATIONS

Toumazou et al., "Regulated Cascode Switched–Current Memory Cell", *Electronic Letters*, vol. 26, No. 5, pp. 303–305, Mar. 1990.

Toumazou et al., "High–Performance Algorithmic Switch–Current Memory Cell", Electronics Letters, Sep. 1990, vol. 26, No. 19, pp. 1593–1595.

Hughes et al., "S$^2$I: A Switched–Current Technique for High Performance", Electronics Letters, Aug. 1993, vol. 29, No. 16, pp. 1400–1401.

Guggenbühl et al., "Switched–Current Memory Circuits for High–Precision Applications", IEEE Journal of Solid–State circuits, Sep. 1994, vol. 29, No. 9, pp. 1108–1116.

Song et al., "A Clock Feedthrough Reduction Circuit for Switched–Current Systems", IEEE Journal of Solid–State Circuits, Feb. 1993, vol. 28, No. 2, pp. 133–137.

Groeneveld et al., "A Self–Calibration Technique for Monolithic High–Resolution D/A Converters", IEEE Journal of Solid–State Circuits, Dec. 1989, vol. 24, No. 6, pp. 1517–1522.

Helfenstein et al., "Clockfeedthrough Compensation Technique for Switched–Current Circuits", IEEE Transactions on Circuits and Systems, Mar. 1995, vol. 42, No. 3, pp. 229–231.

*Primary Examiner*—Timothy P. Callahan
*Assistant Examiner*—Terry L. Englund
*Attorney, Agent, or Firm*—Thomas Schneck; Rosalio Haro

[57] ABSTRACT

A current cell for switch current circuits includes first and second MOS transistors connected in series between a constant current source and a reference ground. The first MOS transistor has its drain coupled to the constant current source and the second MOS transistor has its source coupled to the reference ground. Each of the two MOS transistors has a respective first and second switch coupling its control gate to its drain. The sample phase of a sample and hold operation is broken down into a first and second sample sub-phase, and an input current is applied to the current cell during both sample sub-phases. During the first sample sub-phase, the second MOS transistor memorizes a gate voltage corresponding to the input current, constant current source current and a clock feedthrough error. A channel effect is purposely induced in the second MOS transistor to a degree sufficient to compensate for, and correct, its clock feedthrough error. A modulation voltage is induced at the drain of the second transistor as a result of the channel effect, and the first MOS transistor is used to store and maintain this modulation voltage at the drain of the second MOS transistor during the hold phase.

31 Claims, 7 Drawing Sheets

1

CLOCK FEEDTHROUGH REDUCTION SYSTEM FOR SWITCHED CURRENT MEMORY CELLS

TECHNICAL FIELD

The invention relates to switch current memory cells with reduced clock feedthrough error.

BACKGROUND ART

After many years of declining interest, there is currently a growing interest in integrated analog circuits, such as integrated analog signal processors. Traditionally, these circuits are designed in the voltage domain and sometimes accomplished their task by transferring voltages from one capacitor to another. To achieve high precision, however, this approach requires large, linear integrated capacitors which, in turn, require high end CMOS processes using special techniques such as a double-poly process. These special CMOS techniques are difficult to implement in VLSI, and even LSI, processes.

Switch current, "SI", circuitry is a new approach by which analog functions are accomplished by manipulating current. That is, sampled current magnitudes, as opposed to voltage magnitudes, are used to represent signals. Since SI circuits operate in the current domain, they can operate with lower supply voltages and consume less power than more traditional voltage based analog ICs. Even more beneficial, since SI circuits manipulate signals through the steering of current instead of the charging and discharging of capacitors, they do not require high quality linear capacitors to achieve high performances and can potentially achieve higher speeds. Therefore, SI circuits do not require special CMOS process techniques and can be implemented using standard digital VLSI processing. As a result, SI allows one to combine both digital and analog functions on a common IC.

SI circuitry, however, does have some drawbacks. First, to achieve a high performance circuit, each sampled current magnitude must have a high level of precision. If standard current mirrors are used, the transistors in both branches of a current mirror must be very closely matched to ensure an accurate output copy of an input current. Standard CMOS processes cannot achieve a sufficiently high matching of transistors for high performance SI circuits.

This dependence on transistor matching can be avoided by using current memory cells. As depicted in FIG. 1, a current memory cell 11, also known as a current copier or dynamic current mirror, should be capable of making an accurate copy of an input current, $I_{in}$, during a sample phase of operation and then to reproduce the copied current as an output current, $I_{out}$, during a hold phase of operation. The current memory cell 11 can effectively be thought of as a current based sample-and-hold circuit. During a first phase of operation, $\Phi 1$, switch 13 is closed, switch 15 is opened and the sample-and-hold control input, S/H, is set to sample, "S". During this time, the input current $I_{in}$ is measured and a copy of the input current $I_{in}$ is made by the current memory cell 11. During a second phase of operation, $\Phi 2$, switch 13 is opened, switch 15 is closed and the S/H control input is set to hold, "H". The current memory cell 11 will then generate an output current $I_{out}$ having an equal magnitude as that measured for $I_{in}$. Since $I_{out}$ is based on a measurement of $I_{in}$ and not on $I_{in}$ directly, current memory cell 11 is not dependent on static element matching and can therefore be used in high-precision application using standard CMOS processes.

With reference to FIG. 2, an internal view of a basic current memory cell 11 is shown. An input current $I_{in}$ may

2 be bidirectional, but due to physical requirements of the current duplicator 10, which requires some elements to be constantly forward biased, it is necessary to use an offset constant current source 17. Current source 17 provides a reference current $I_{ref}$ which when added to $I_{in}$ at node 25 assures that the current duplicator 10 always sees a unidirectional current.

During a sample phase $\Phi 1$ when switch 13 is closed and switch 15 is opened, the current duplicator 10 receives a current of $I_{ref}+I_{in}$ at node 25. During the hold phase $\Phi 2$, switch 13 is opened, switch 15 is closed and the current duplicator 10 ideally maintains a constant current value of $I_{ref}+I_{in}$. Constant current source 17 supplies current $I_{ref}$, but since switch 15 is closed, an inverted copy of the input current, $-I_{in}$, must be supplied by $I_{out}$ to node 25.

A typical circuit level implementation of a basic prior art current memory cell is shown in FIG. 3. The current duplicator 10 is shown to include an nMOS transistor 19 providing a current path from node 25 to ground and having an intrinsic gate-to-source capacitance 21. A switch 23 couples node 25 to the gate of transistor 19 during the sample phase $\Phi 1$ and isolates node 25 from the gate of transistor 19 during a hold phase $\Phi 2$.

During the sample phase $\Phi 1$ switches 13 and 23 are closed and switch 15 is opened. The input current $I_{in}$ and reference current $I_{ref}$ are summed at node 25 and applied to the drain of transistor 19. With switch 23 closed, transistor 19 functions as a forward biased, diode-connected transistor and the intrinsic capacitor 21 charges up to a gate voltage, $V_g$, necessary to produce the current $I_{ref}+I_{in}$ through transistor 19.

During the hold phase $\Phi 2$, switches 13 and 23 are opened and switch 15 is closed. The gate voltage $V_g$ required to produce the current $I_{ref}+I_{in}$ will be maintained by intrinsic capacitance 21. In effect, transistor 19 now behaves like a memory nMOS transistor. The input current $I_{in}$ is thereby memorized. Since constant current source 17 supplies $I_{ref}$ but memory transistor 19 requires $I_{ref}+I_{in}$, current $I_{in}$ must be supplied by a load at the output and the output current $I_{out}$ becomes an inverse copy of the input current, $-I_{in}$.

The basic current memory cell 11 of FIG. 3 suffers from two basic problems resulting from its physical circuit structure. The first problem is an error introduced by channel length modulation of transistor 19 caused by the channel effect. The channel effect changes the transconductance gain of transistor 19, and thereby, changes the amount of current sourced for a given gate voltage $V_g$. Transistor 19 will suffer from the channel effect if its drain-to-source voltage, $V_{ds}$, is not maintain constant during both the sample and the hold phases. That is, if the $V_{ds}$ voltage of transistor 19 resulting from an input signal through switch 13 is different than the $V_{ds}$ voltage of transistor 19 resulting from a load signal through switch 15, then transistor 19 will introduce an error current due to the channel effect in spite of maintaining its gate voltage $V_{gs}$ constant.

It has been shown in *Electronics Letters*, 1990, Vol. 26, No 19, pages 1593–1595 and in *Electronics Letters*, 1990, Vol. 26, No 5, pages 303–305 that the use of simple and regulated cascodes applied between node 25 and the drain of memory transistor 19 will mitigate the channel effect by maintaining the $V_{ds}$ of transistor 19 relatively constant in spite of voltage fluctuations at node 25. U.S. Pat. No. 5,296,752 to Groeneveld et al. teaches a current memory cell using regulated cascodes.

The second problem afflicting current memory cells results from the physical behavior of switch 23. With reference to FIG. 4, switch 23 is implemented, as is common in the art, as an nMOS transistor 27. Transistor 27 selectively couples node 25 to the gate of memory transistor 19 in response to control input S/H. An intrinsic gate-to-source capacitance 29 of transistor 27 effectively couples signal S/H to the gate of memory transistor 19. Thus, when signal S/H changes from the sample phase to the hold phase, i.e. changes from high to low, a proportional voltage drop is transmitted to the gate of transistor 19 by means of capacitance 29. This introduces a first gate voltage error at the gate of transistor 19 referred to as overlap capacitance error.

Switch transistor 27 also introduces a second error. When control input S/H applies a high voltage to the gate of switch transistor 27, a certain amount of charge, q1+q2, collects in its channel region. When signal S/H is brought low, charge q2 leaves the channel region through the drain, but charge q1 leaves the channel region through the source and redistributes itself at the gate of memory transistor 19. This introduces a second gate error referred to as charge injection which, together with the overlap capacitance error, applies a net gate error voltage $V_{cft}$ at the gate of memory transistor 19. The net gate error voltage $V_{cft}$ is commonly referred to as a clock feedthrough error and can severely limit the performance of a current memory cell.

The amount of clock feedthrough error is dependent on the relative capacitances of switch transistor 27 and memory transistor 19. It has been found that the addition of a large physical capacitor coupled between the gate and source of memory transistor 19 can reduce, but not eliminate, clock feedthrough error. The current memory cell taught in U.S. Pat. No. 5,296,752 to Groeneveld et al. also shows the use of added physical capacitors. The size of an additional capacitor, however, is restricted by real estate and frequency limitations.

In *Electronics Letters*, 1993, Vol. 29, no. 16, pages 1400–1401, Hughes et al. presents a current memory cell similar to that taught in U.S. Pat. No. 4,958,123 to Hughes, and which reduces clock feedthrough error by breaking down the sample phase Φ1 into first and second sample sub-phases, Φ1a and Φ1b, respectively.

With reference to FIG. 5, during the first sample sub-phase Φ1a, Hughes's current memory cell behaves like the typical current memory cell discussed thus far having an input current $I_{in}$ and a reference current source $I_{ref}$. During this first sample sub-phase Φ1a, switches 33, 43 and 49 are closed and switches 35 and 45 are opened. Thus pMOS transistor 31 behaves like a constant current source controlled by a constant voltage Vref. Hughes's memory cell ends the first sub-phase Φ1a by opening switch 49 and thereby memorizing the input current $I_{in}$, reference current $I_{ref}$ and an additional first clock feedthrough error current in a manner similar to a typical current memory cell by using a capacitor 46 across the gate and source electrodes of an nMOS memory transistor 47.

Unlike a typical current memory cell, however, the input current $I_{in}$ remains applied to the current memory cell by means of switch 43, which remains closed for a period after switch 49 is opened and the nMOS memory transistor 47 has memorized the aforementioned currents.

This period constitutes the second sample sub-phase Φ1b. During the second sample sub-phase Φ1b, the Hughes current source $I_{ref}$ is converted into a diode connected pMOS transistor by opening switch 33 and closing switch 35. Effectively, this forms a second memory transistor 31, albeit of PMOS type. The diode connected PMOS transistor 31 supplies any current required by the nMOS memory transistor 47 which is not supplied by the input current $I_{in}$. That is, the pMOS memory transistor supplies both the reference current previous controlled by Vref and the additional first clock feedthrough error current introduced by the action of switch 49 on nMOS memory transistor 47. Thus, the input current $I_{in}$ is not affected even though the nMOS memory transistor 47 does not source equal sums of current during the first Φ1a and second Φ1b sample sub-phases.

Once the pMOS memory transistor has settled, the hold phase Φ2 begins by opening switches 43 and 35 and closing switch 45. This causes the pMOS memory transistor 31 to memorize its current by means of a second capacitor 37. The breaking of the diode connection of the pMOS transistor 31 cause an additional, second feedthrough error to be memorized by capacitor 37. According to Hughes, node 30, which joins the drains of the pMOS 31 and nMOS 47 memory transistors, behaves like a virtual ground and its voltage remains unchanged in spite of the addition or removal of $I_{in}$. Therefore, the drain-to-source voltages of transistors 31 and 47 remain relatively unchanged and thereby reduces the channel effect. Hughes further explains that the second clock feedthrough error introduced by pMOS memory transistor 31 can be made relatively constant so that it may be canceled in a later circuit stage.

It is an object of the present invention to provide a current memory cell with reduced clock feedthrough error.

It is another object of this invention to provide a current memory cell which is not ill affected by the channel effect of the memory transistor.

It is another object of this invention to provide a current memory cell which compensates for clock feedthrough error and the channel effect simultaneously without much added complicated circuitry.

It is another object of this invention to provide a current memory cell which does not rely solely on the storage of the gate-to-source voltage of a memory transistor to memorize an input current.

DISCLOSURE OF THE INVENTION

The above objects have been met in a current memory cell which takes advantage of the channel effect and uses it as part of a two-tier sample phase to memorize an input current. The current memory cell of the present invention has a sample phase and a hold phase, but the sample phase is divided into a sample-capture phase and the sample-correct phase.

A current memory cell in accord with the present invention includes an input switch for coupling an input current to a summation node during both sample-capture and sample-correct phases, a constant current source continually feeding into the summation node, an output switch for coupling the summation node to an output lead during the hold phase, a means for storing a modulation voltage and a current duplicator cell. The means for storing a modulation voltage is coupled to the summation node and is referred to as a modulation voltage memory in the present disclosure. The modulation voltage memory is further connected in series with the current duplicator between the summation node and a reference ground. The current duplicator includes a memory transistor.

The current duplicator is responsive to the sample-capture phase and the modulation voltage memory is responsive to the sample-correct phase. During the sample-capture phase, the sum of an input current, the constant current source and a clock feedthrough error are memorized in the current duplicator. With the input current still applied to the summation node, the sample-correct phase purposely induces the channel effect in the memory transistor of the current duplicator to a degree sufficient to cancel the effects of the memorized clock feedthrough error. A drain voltage change directly resulting from the channel effect is induced at the node coupling the current duplicator to the modulation voltage memory. The drain voltage change is used as a measure of the amount of channel effect induced in the current duplicator to compensate for clock feedthrough error.

The modulation voltage memory responds to the sample-correct phase by memorizing the drain voltage change and maintaining the drain voltage change during the hold phase.

During the hold phase, both the measure of the channel effect and the sum of the input current, constant current source and clock feedthrough error are applied to the current duplicator to reproduce the input current with a canceled channel effect error.

In the present embodiment of the invention, the current duplicator is implemented as a first memory MOS transistor having a first sample switch selectively coupling the gate of the first memory transistor to its drain. The modulation voltage memory is implemented as a second memory transistor having a drain coupled to the summation node, a source coupled to the drain of the first memory transistor and a second sample switch selectively coupling the gate of the second memory transistor to its drain.

BEST MODE FOR CARRYING OUT THE INVENTION

Figure 1:
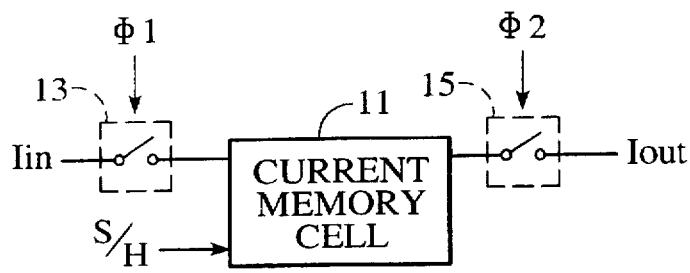
FIG. 1 is a block diagram of an ideal current memory cell.
Figure 2:
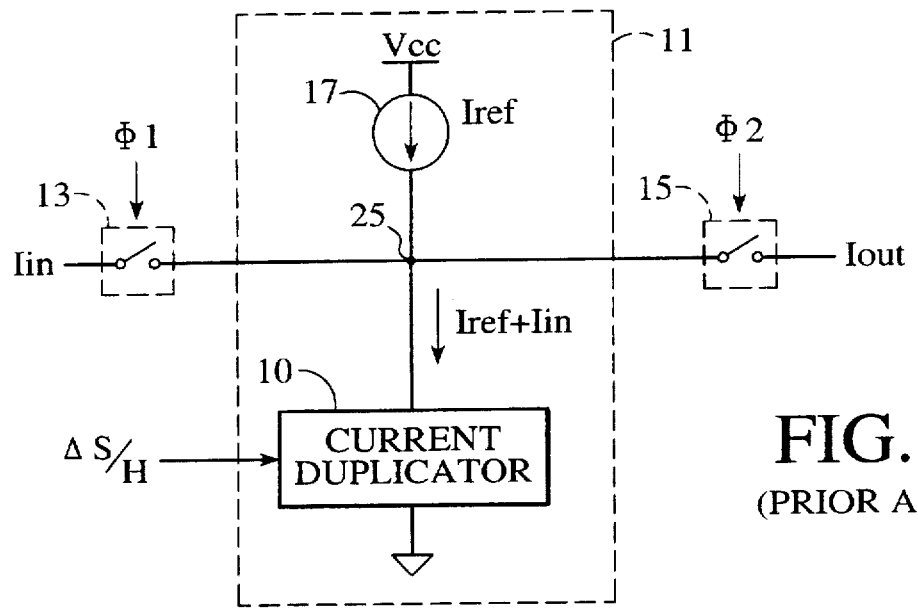
FIG. 2 is a basic prior art current memory cell.
Figure 3:
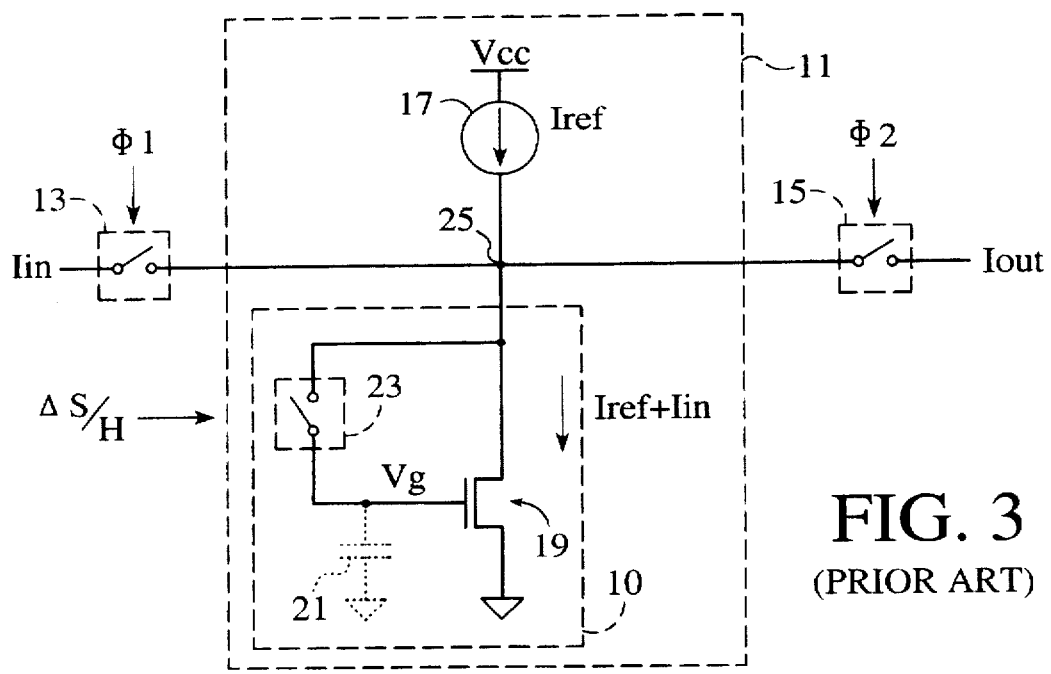
FIG. 3 is a prior art transistor level current memory cell showing the current duplicator of FIG. 2.
Figure 4:
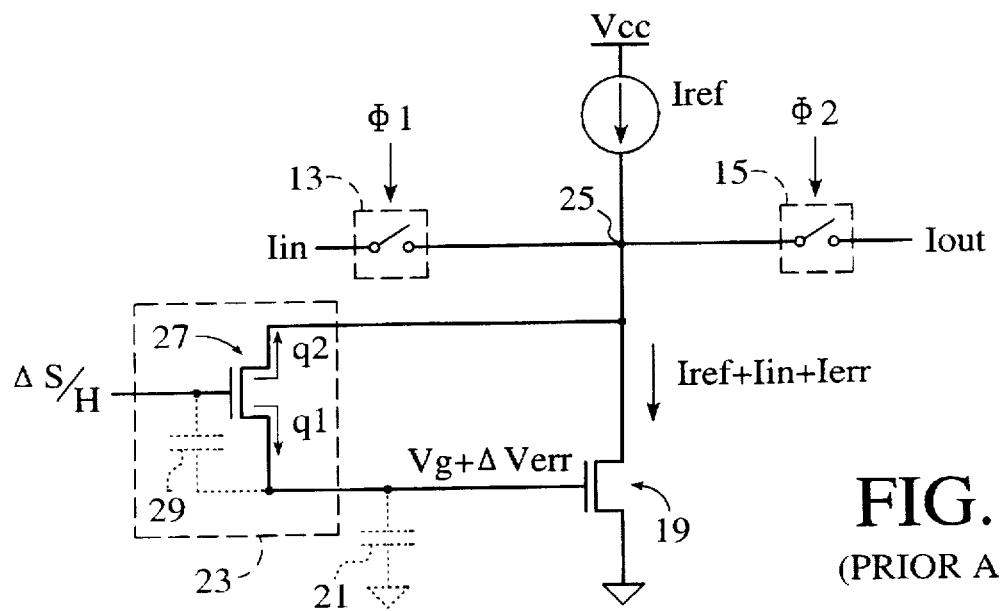
FIG. 4 is a transistor level circuit identifying a source of error in the basic prior art current memory cell of FIG. 3.
Figure 5:
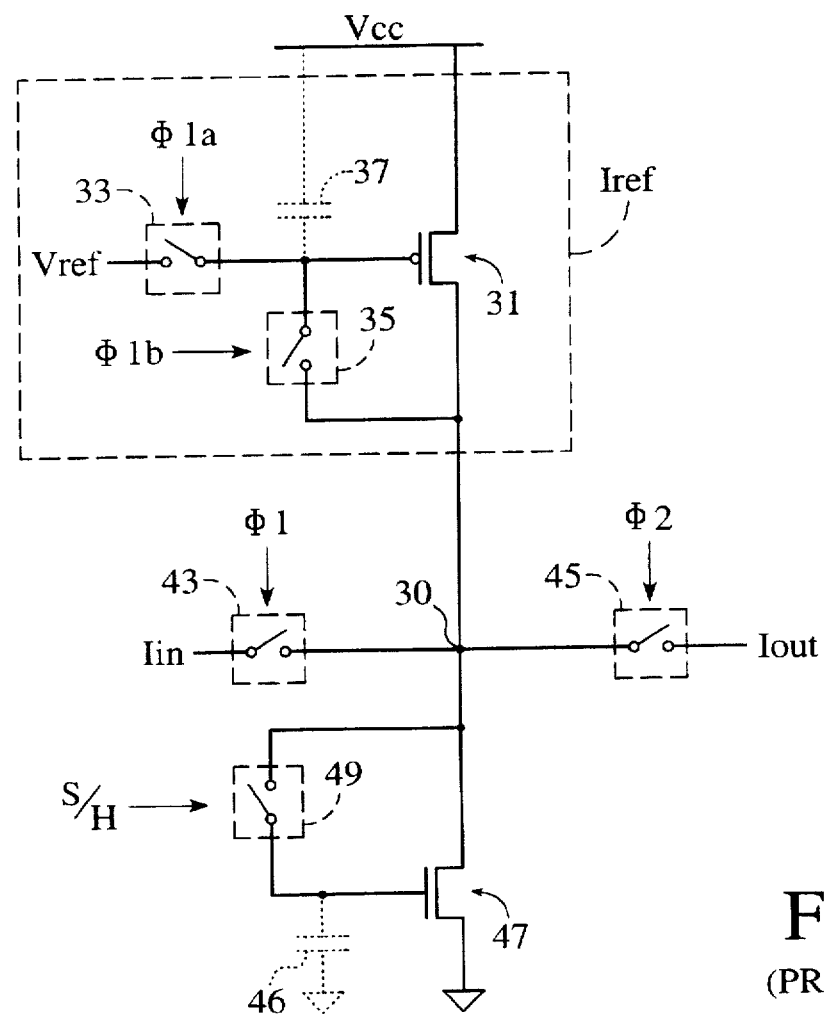
FIG. 5 is a prior art current memory cell which divides a sample phase of a sample-and-hold current memory cell into two sample sub-phases.
Figure 6:
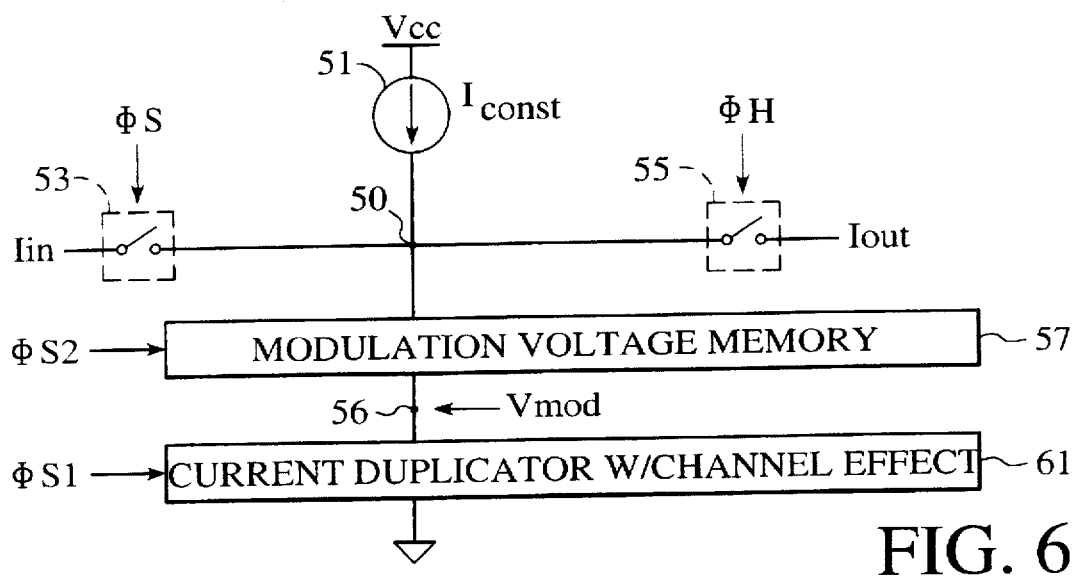
FIG. 6 is a block diagram of a current memory cell in accord with the present invention.

With reference to FIG. 6, a constant current source 51 supplies a constant current, $I_{const}$, to current summation node 50. An input current $I_{in}$ has access to current summation node 50 by means of switch 53, and an output current $I_{out}$ has access to current summation node 50 by means of switch 55. A means for storing a modulation voltage 57 and a current duplicator cell 61 are connected in series between current summation node 50 and a reference ground.

The operation of the current memory cell of FIG. 6 is divided into a sample phase $\Phi S$ and a hold phase $\Phi H$. The sample phase $\Phi S$ is further divided into a first sample-capture phase $\Phi S1$ and a second sample-correct phase $\Phi S2$. During both sample phases $\Phi S1$ and $\Phi S2$, switch 53 is closed allowing $I_{in}$ access to node 50, and switch 55 is opened isolating node 50 from $I_{out}$.

The sample phase $\Phi S$ begins with the sample-capture phase $\Phi S1$ during which $I_{in}$ plus $I_{const}$ pass unimpeded from node 50 through the modulation voltage memory 57 and current duplicator 61 to reference ground. The current duplicator 61 obtains a measure of the current, and the $\Phi S1$ lead signals the end of the sample-capture phase causing the current duplicator to store a current of $I_{in}+I_{const}$ and begin sourcing an equivalent current plus a clock feedthrough error.

Ordinarily, the clock feedthrough error would cause the current duplicator 61 to introduce an error current component to the stored current of $I_{in}+I_{const}$ but since the current memory cell of FIG. 6 is still in a sample mode and switch 53 remains closed, the total current entering node 50 remains unchanged at $I_{in}+I_{const}$. Therefore, the current duplicator 61 is forced to source the same amount of current during the sample-correct phase $\Phi S2$ as it did during the sample-capture phase $\Phi S1$ in spite of its clock feedthrough error. This forcing of current causes the current duplicator 61 to induce the channel effect causing a modulation voltage $V_{mod}$ at node 56, as explained below. The modulation voltage $V_{mod}$ is effectively a corrective voltage to cancel the effects of the clock feedthrough error incurred by the current duplicator 61.

Once node 56 has settled to the modulation voltage $V_{mod}$ necessary for compensating for the clock feedthrough error, lead $\Phi S2$ signals the end of the sample-correct phase causing the modulation voltage memory 57 to store the value of $V_{mod}$. The end of the sample-correct phase $\Phi S2$ also signals the end of the overall sample phase $\Phi S$ which causes switch 53 to open and switch 55 to close.

This constitutes the hold phase $\Phi S2$. Although $I_{in}$ is no longer applied to node 50, the modulation voltage memory 57 maintains a voltage $V_{mod}$ constant at node 56. Therefore, the current duplicator 61 is forced to maintain the amount of channel effect necessary to compensate for, and correct the clock feedthrough error it had incurred during the sample-capture phase $\Phi S1$. As a result, the current duplicator 61 continues to source a current equal to $I_{in}+I_{const}$ in spite of its clock feedthrough error. Since the constant current source 51 supplies $I_{const}$, $I_{out}$ must supply a value of $-I_{in}$.

Furthermore, unlike much of the prior art which needs to concern itself with additional circuitry to reduce the channel effect of the current duplicator 61 and thereby mitigate any additional errors caused by the channel effect, the current memory cell actually encourages the channel effect on the duplicator cell 61. In fact, the current memory cell of the present invention stores and reproduces a copied input current $I_{in}$ by storing a measure, $V_{mod}$, of the channel effect and then forcing the current duplicator 61 to induce within itself the measured amount of channel effect.

Figure 7:
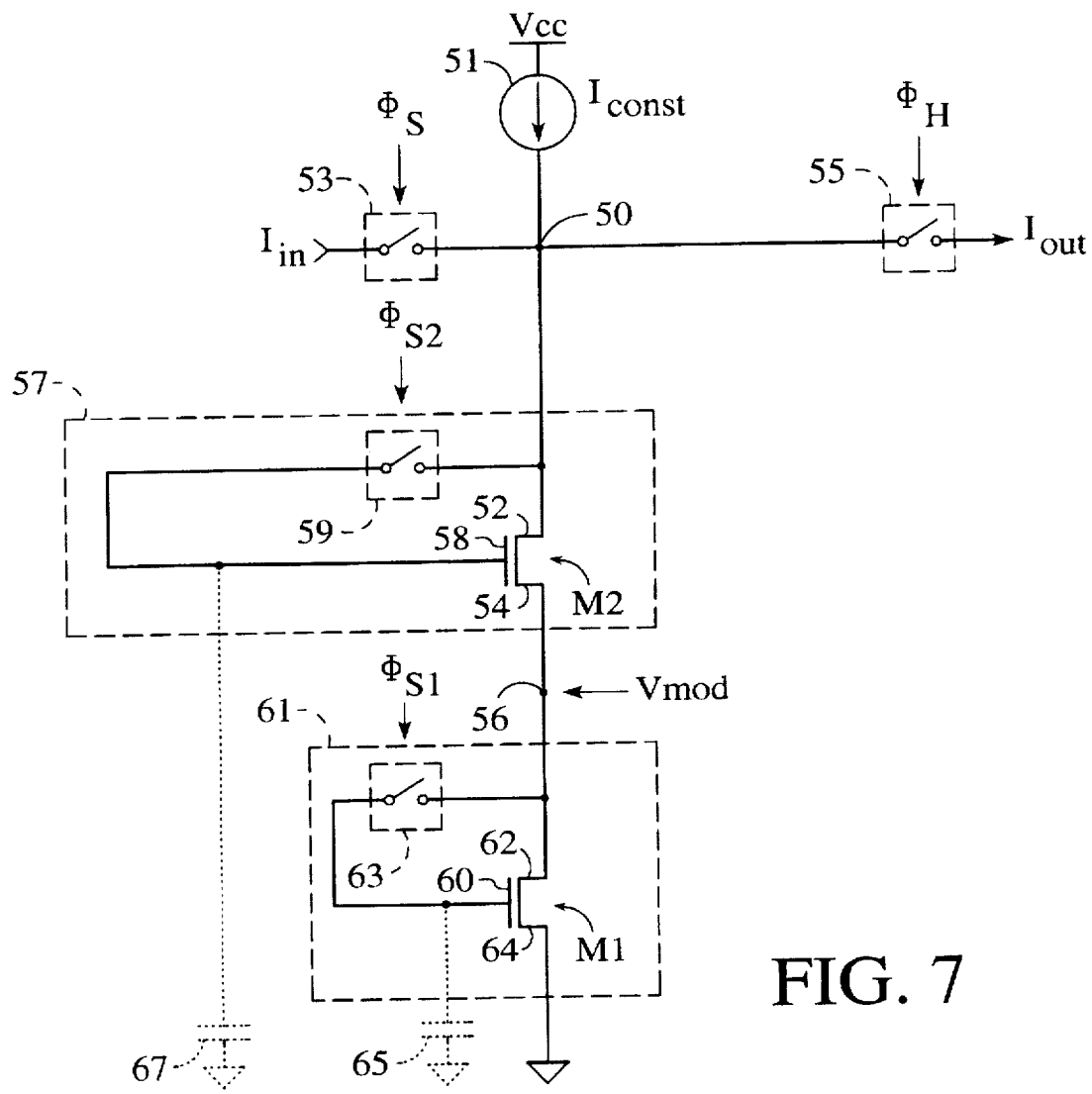
FIG. 7 is a transistor level implantation of a current memory cell in accord with the present invention.

With reference to FIG. 7, a transistor level implementation of a current memory cell in accord with the present invention is shown. Elements in FIG. 7 having similar functions as in FIG. 6 are given similar reference characters and are explained above.

In FIG. 7, the current duplicator 61 is shown to consist of a memory transistor M1 having a gate 60 selectively coupled to its drain 62 by means of a switch 63 responsive to lead $\Phi S1$. The source 64 of memory transistor M1 is coupled to a reference ground, and an intrinsic capacitance 65 couples its gate electrode 60 to its source electrode 64.

In this embodiment, the modulation voltage memory 57 has a structure similar to that of the current duplicator 61, but it would be understood by those in the art that other methods of storing a voltage $V_{mod}$ are available. The modulation voltage memory 57 includes a second nMOS memory transistor M2 having its drain 52 coupled to current summation node 50, and having its source 54 coupled to the drain 62 of M1 at node 56. The gate 58 of M2 is selectively coupled to its drain 52 by means of a second switch 59 responsive to lead ΦS2.

The sample capture phase ΦS1 begins by closing switches 53, 59 and 63, and opening switch 55. Summation node 50 then receives currents $I_{in}$ and $I_{const}$. The sum of currents $I_{in}$ and $I_{const}$ passes through memory transistor M2 of the modulation voltage memory 57 and memory transistor M1 of the current duplicator 61.

With switch 63 closed, M1 is diode connected and its gate 60 to source 64 voltage is the same as its drain 62 to source 64 voltage. The voltage at the gate 60 of M1 then rises to a value conducive to a drain 62 to source 64 current of $I_{in}+I_{const}$. Intrinsic capacitance 65 charges up to the value of the gate 60 voltage.

With switch 59 closed, M2 is also diode connected and its gate 58 to source 54 voltage also adjusts its self to a value conducive to a current of $I_{in}+I_{const}$. However, since the source 54 of M2 is connected to the drain 62 of M1, the voltage at the gate 58 of M2 tracks the voltage at the drain 62 of M1.

Once gate 60 of M1 has settled to a steady voltage, lead ΦS1 signals the end of the sample-capture phase ΦS1 and the beginning of the sample-correct phase ΦS2 by opening switch 63. All other switches remain unchanged. The opening of switch 63 adds a first clock feedthrough error voltage, $V_{cft}1$, to capacitance 65 due to overlap capacitance and charge injection of switch 63, as explained above. Thus memory transistor M1 wants to drive a current of $I_{in}+I_{const}$ plus an additional error current component corresponding to the added clock feedthrough error voltage $V_{cft}1$ at its gate. But since the currents $I_{in}$ and $I_{const}$ entering summation node 50 remain unchanged, M1 is forced to continue sourcing the same current of $I_{in}+I_{const}$ in spite of the first clock feedthrough error voltage $V_{cft}1$.

This means that while M1 originally sourced a current of $I_{in}+I_{const}$ for a given gate voltage $V_g$, it must now source the same current of $I_{in}+I_{const}$ for a different gate voltage of $V_g+V_{cft}1$. In order to do this, the transconductance gain of M1 must necessarily change. This is brought about by the action of the channel effect on M1. That is, the size of the inversion channel in M1 is forced to modulate to achieve a new transconductance gain, gm. The new gm, then causes the voltage at the drain 62 of M1 to change. In essence, the voltage at drain 62 becomes a measure of the amount of the channel effect necessary to compensate for, and correct, the clock feedthrough error $V_{cft}1$ of M1 and maintain a constant current of $I_{in}+I_{const}$.

Figure 8:
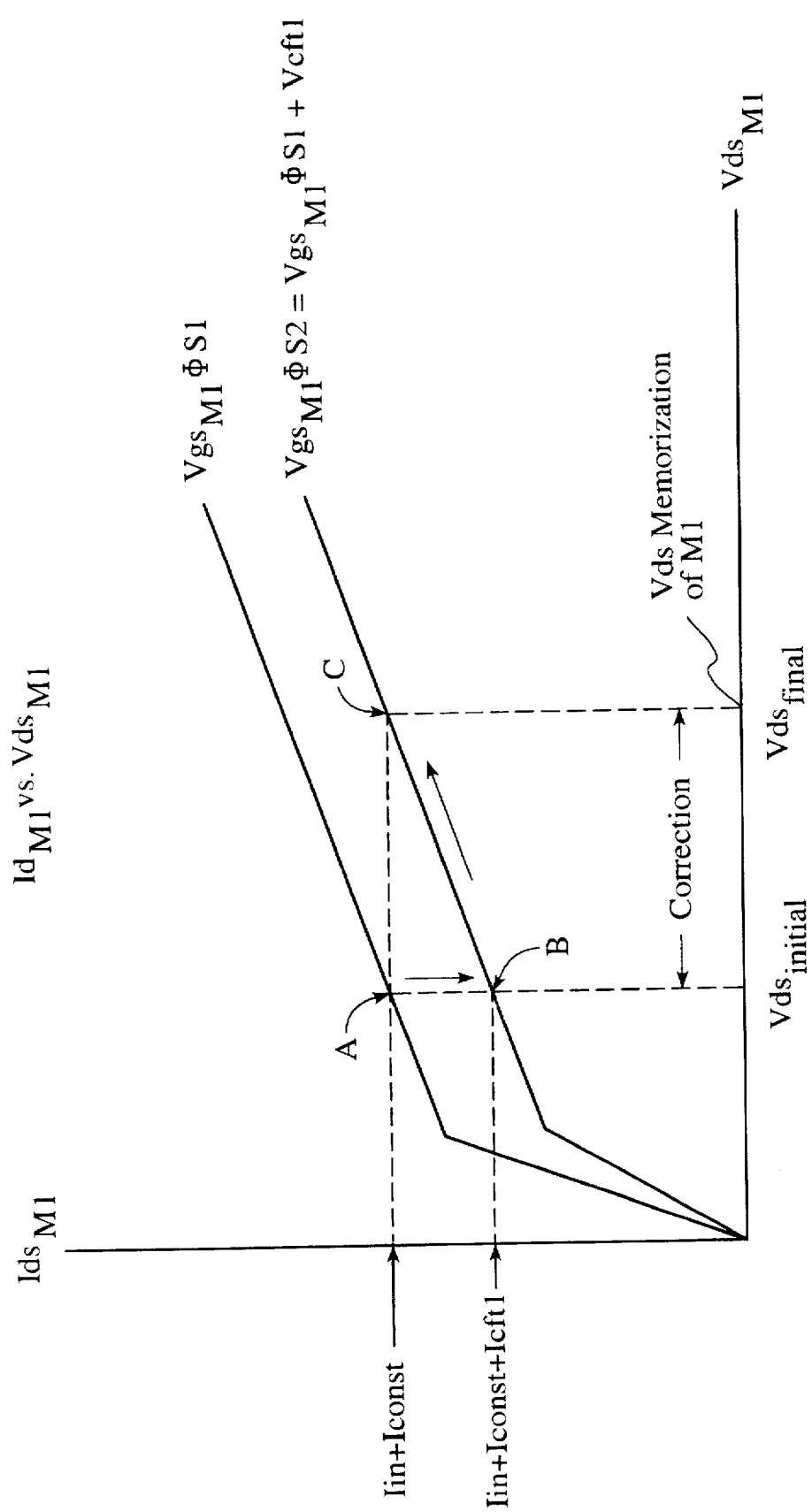
FIG. 8 is a family of $V_{gs}$ current curves showing the behavior of the memory transistor of FIG. 7.

The effects of the channel effect on M1 are graphically illustrated in FIG. 8. In FIG. 8, the drain-to-source current $Ids_{M1}$ versus the drain-to-source voltage $Vds_{M1}$ of transistor M1 is shown for two gate-to-source voltage, $Vgs_{M1}$, of M1.

Curve $Vgs_{M1}$ΦS1 is an illustration of the current curve in M1 at the end of the sample-capture phase ΦS1. That is, $Vgs_{M1}$ΦS1 represents the gate voltage on M1 at the end of the sample-capture ΦS1 phase when the gate voltage at M1 has risen to a value conducive for conducting a current of $I_{in}+I_{const}$. Once the gate voltage of M1 has settled to a gate value of $Vgs_{M1}$S1, its drain voltage will have reached a corresponding initial value of $Vds_{initial}$. This is identified as point "A" on the graph.

At the beginning of sample-correct phase ΦS2 when switch 63 has opened, a first clock feedthrough error voltage $V_{cft}1$ is added to the gate voltage of M1. Curve $Vgs_{M1}$ΦS2 identifies this new gate voltage and is equal to the gate voltage at the end of the sample-capture phase, $Vgs_{M1}$ΦS1, plus $V_{cft}1$.

In FIG. 8, it is assumed that switch 63 of FIG. 7 is implemented as an nMOS transistor, and $V_{cft}1$ is therefore further assumed to have a negative value. As a result, FIG. 8 shows that $V_{cft}1$ causes the gate voltage M1 to drop.

This assumption is based on two factors. One, if switch 63 is an nMOS device, then it will open in response to lead ΦS1 changing from high to low. This would cause a proportional downward drop on the gate voltage of M1 due to the overlap capacitance of switch 23 and memory transistor M1. Secondly, if switch 23 is an nMOS device then the charge injection at the gate of M1 due to the opening of switch 23 will result in an increase of negative charge electrons which would further lower the gate voltage of M1. However, these assumptions are made purely for illustrative purposes and the polarity of $V_{cft}1$ is not crucial to the invention.

At the beginning of the sample-correct phase ΦS2, identified as point "B" in FIG. 8, switch 63 has opened and the gate voltage of M1 is dropped to a new value of $Vgs_{M1}$ΦS2. For a given constant drain-to-source voltage of $Vds_{initial}$, a drop in the gate voltage of M1 would likewise cause a drop in the drain current of M1 from its initial value of $I_{in}+I_{const}$ at operating point "A" to a value reduced by an error current Icft1 at operating point "B".

However, since M1 in the current cell of the present invention is forced to maintain a constant current of $I_{in}+I_{const}$ in spite of the change in its gate voltage, the channel effect is induced in M1. M1 must therefore source more current for a given lower gate voltage. As a result, its transconductance gain must modulate, in this case increase, and this causes its drain voltage to modulate, i.e. rises, accordingly to a new value of $Vds_{final}$ at operating point "C". The drain current of M1 at operating point "C" is restored to its initial value of $I_{in}+I_{const}$ and the final drain voltage $Vds_{final}$ is an indicator of the new transconductance gain M1 needs to compensate for the clock feedthrough error $V_{cft}1$ caused by switch 63. In effect, the difference of $Vds_{final}$ and $Vds_{initial}$ is a measure of the change in the transconductance gain, i.e. the extent of channel effect, needed to correct the clock feedthrough error $V_{cft}1$ of M1.

The modulation drain voltage $Vds_{final}$ at the drain 62 of M1 is identified as $V_{mod}$ in FIG. 7. As explained above, the gate 58 voltage of M2 tracks the drain 62 voltage of M1. Therefore, the gate 58 voltage of M2 adjusts, i.e. modulates, by a similar amount as the drain 62 voltage of M1, and the gate 58 voltage of M2 becomes a measure of $V_{mod}$.

At the end of the sample-correct phase ΦS2, switches 59 and 53 are opened and switch 55 is closed. The opening of switch 59 causes the gate 58 voltage of M2, which holds a measure of the corrective voltage $V_{mod}$, to be stored in intrinsic capacitance 67. By maintaining the gate 58 voltage of M2 constant, capacitance 67 effectively maintains $V_{mod}$ constant and thereby forces M1 to sustain the amount of channel effect necessary to maintain a current of $I_{in}+I_{const}$. In other words, the current memory cell of the present invention stores an input current by storing the drain voltage of the memory transistor M1.

Capacitance 67 also stores a second clock feedthrough error, $V_{cft}2$, at the gate 58 of M2 caused by switch 59, and $V_{cp}2$ introduces an error voltage into $V_{mod}$ at node 56. Although the charge injection on M2 due to switch 59 may be the same as the charge injection on M1 due to switch 63, the effect of the second clock feedthrough error $V_{cp}2$ on the $I_{ds}$ current through M2 and M1 is much lower than the effect caused by $V_{cp}1$.

This is due to several compound factors, but given that the current through M1 and M2 is defined by $I_{ds}=K1(V_{gs}-V_{th})^2(1+K2V_{ds})$ with K1 being a function of size and technology, K2 being a function of the channel effect and Vth the threshold voltage, it is generally not possible to give an exact quantity for the reduced effect of the second clock feedthrough error $V_{cp}2$ on the $I_{ds}$ current through M2 and M1. The exact error reduction depends on various voltage values, currents, K1, K2 and the technology used, but it has been found that the current error introduced by $V_{cp}2$ is generally 10 to 100 times less than the current error due to $V_{cp}1$ acting on M1 alone, without M2. One may obtain a general feel for the reduced effect of $V_{cp}2$ on M2 by noting that the second clock feedthrough error $V_{cp}2$ is distributed over two memory transistors, M1 and M2, and noting that the voltage values at the electrodes of M2 are much higher than those on M1 so that the relative effect a clock feedthrough error voltage on M2 is proportionally reduced.

Thus the current memory cell of FIG. 7 reproduces an input current not so much by storing the gate-to-source voltage of the memory transistor M1 of the current duplicator, as in the prior art, but rather reproduces an input current by storing the drain-to-source voltage of M1.

Figure 9:
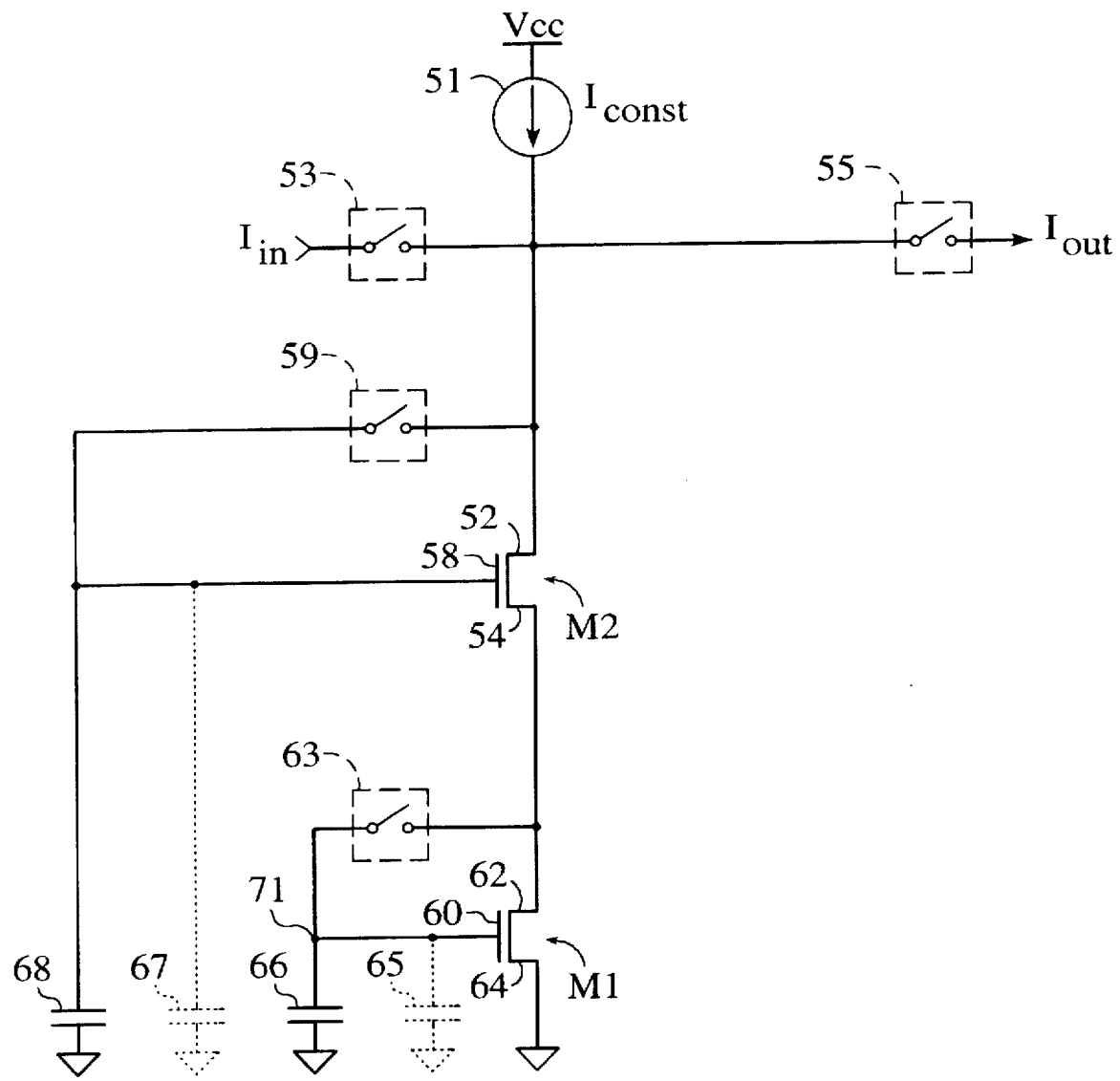
FIG. 9 is a second embodiment of a current memory cell in accord with the present invention having further attenuated clock feedthrough error.

A second embodiment of a current cell in accord with the present invention is shown in FIG. 9. All components having a similar function as the embodiment of FIG. 7 are given similar reference characters and are explained above.

In FIG. 9, a physical capacitor 66 is coupled between the gate 60 of M1 and the reference ground. As explained above, the use of a physical capacitor reduces the clock feedthrough error of M1. As above, M2 stores a corrective modulation voltage $V_{mod}$ taken at the drain 62 of M1 resulting from the channel effect on M1, but although the clock feedthrough error of M1 is canceled by the action of the M2, use of capacitor 66 reduces the amount of correct channel effect endured in M1 and thereby reduces the voltage modulation at the drain 62 of M1. The reduced voltage modulation means that M2 is better able to compensate for the clock feedthrough error of M1.

A second physical capacitor 68 is also coupled between the gate 58 of M2 and the relative ground. The second physical capacitor 68 not only reduces the second clock feedthrough error experienced by M2 in response to switch 59, but also aids in the storing and maintaining of the corrective modulation voltage $V_{mod}$ at the gate 58 of M2.

Figure 10:
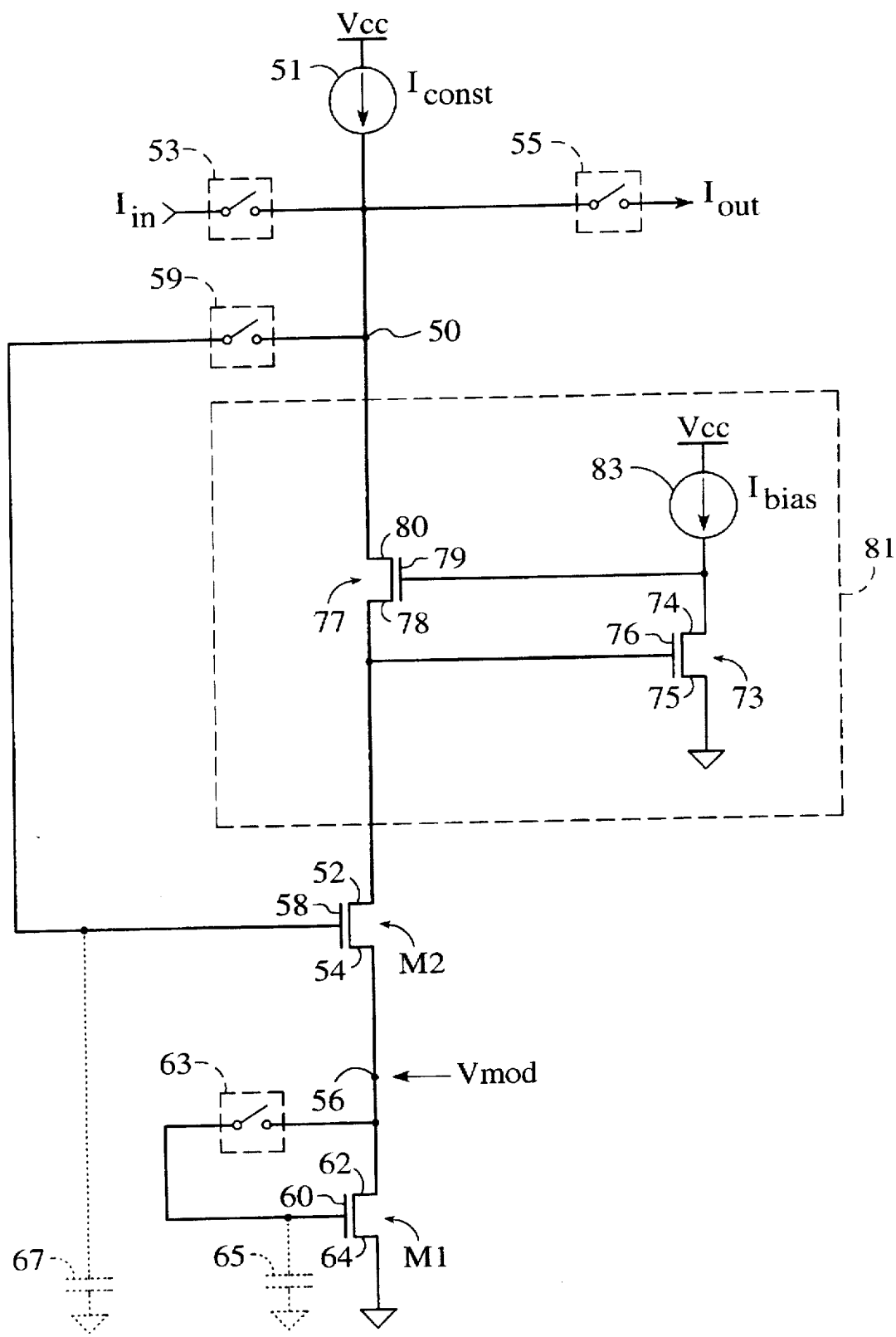
FIG. 10 is a third embodiment of a current memory cell in accord with the present invention having a regulated cascode output stage.

With reference to FIG. 10, all elements having a similar function as in FIG. 7 are given similar reference characters and are explained above. In FIG. 10, a regulated cascode circuit 81 is inserted between the drain 52 of M2 and summation node 50. Regulated cascode circuit 81 greatly increases the output impedance of the current memory cell. It must be emphasized, that while regulated cascodes, in general, have been used in prior art current memory cells for the purpose of reducing the channel effect of the current duplicator memory transistor M1, as explained above, the regulated cascode 81 in FIG. 10 is coupled to modulation voltage memory transistor M2 and not to current duplicator memory transistor M1. Thus, the drain 62 voltage of M1 is not held constant by the regulated cascode 81 and its voltage value 35 is free to modulate in response to the channel effect on M1.

In the present invention, the regulated cascode 81 is used for its more general application in analog circuitry of enhancing the output impedance and lowering the feedback capacitance characteristic of all field effect transistors. By using a cascode circuit stage at M2, the current memory cell of FIG. 10 can achieve a better frequency response and operate under a larger voltage swing at summation node 50. Since switch 59 selectively couples gate 58 of M2 to summation node 50, the regulated cascode circuit 81 is encompassed within the diode connection of M2. Therefore, when switch 59 is closed, regulated cascode 81 acts like the enhanced input stage of a regulated cascode current mirror. When switch 59 is opened and the current memory cell enters the hold phase ΦH, the regulated cascode circuit 81 behaves like a regulated cascode current source.

Use of a regulated cascode circuit 81 provides a better performance than if a simple cascode circuit were used. But those versed in the art would recognize that the use of any cascode circuit, simple or regulated, would enhance the performance of M2 in general. In FIG. 10, a regulated cascode is used since it offers a lower input voltage drop from node 50 and gate 58 of M2 during both the sample phases ΦS1 and ΦS2, while providing a larger output impedance, larger voltage swing and lower output capacitance during the hold phase ΦH. In this manner, $I_{out}$ can be applied to an indeterminate load without much concern about the loading effect on node 50 caused by the load. In other words, the regulated cascode 81 enhances the output stage of the current memory cell at M2 without preventing the current duplicator memory transistor M1 from experiencing the channel effect.

Figure 11:
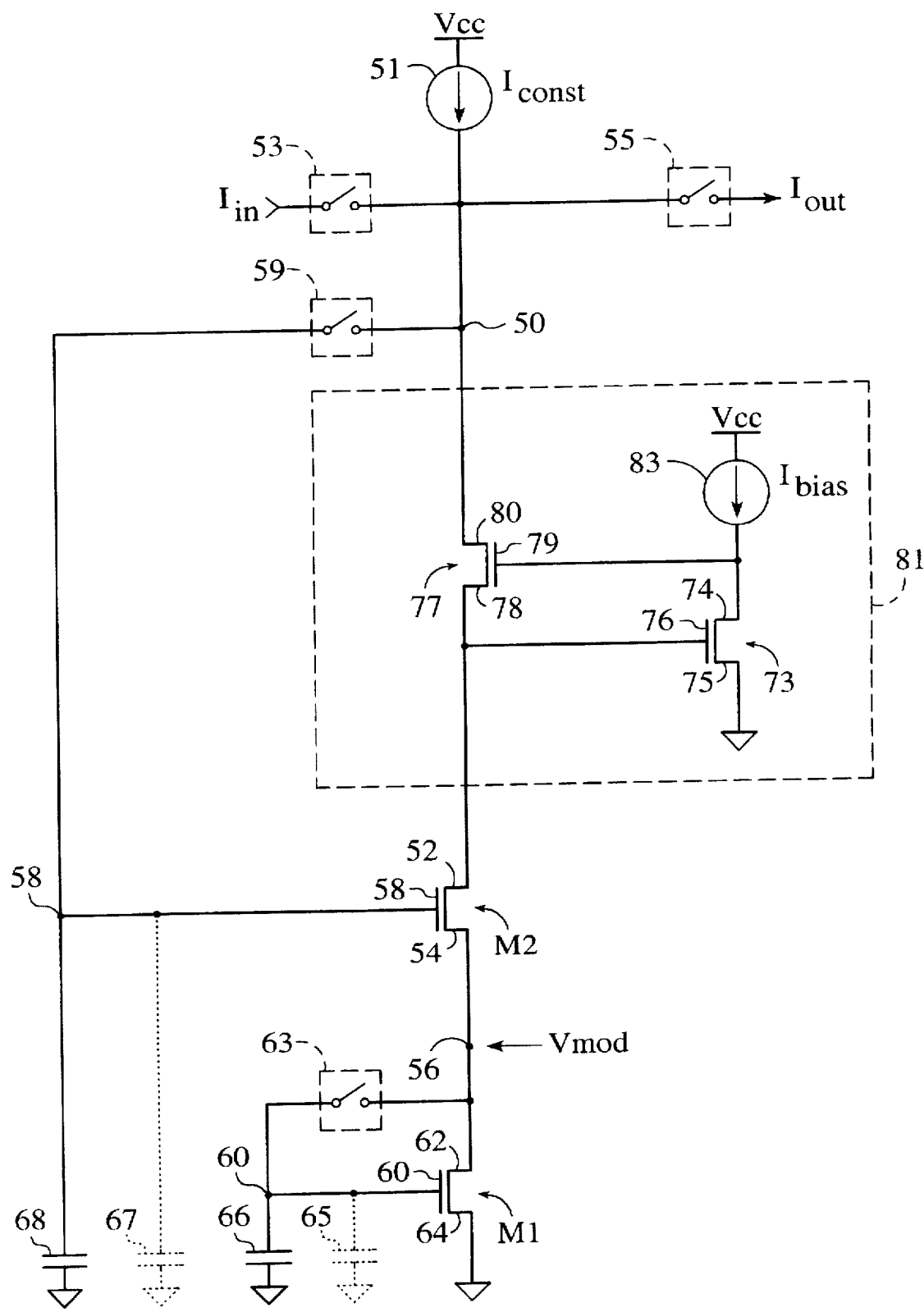
FIG. 11 is the current memory cell of FIG. 10 further augmented by physical memory capacitors.

With reference to FIG. 11, all elements having a similar function as in FIG. 10 are given similar reference characters and are explained above.

In FIG. 11, physical capacitors 66 and 68 taught in FIG. 9 are coupled to gate 60 of M1 and gate 58 of M2, respectively. Also, a regulated cascode circuit 81 is inserted between drain 52 of M2 and node 50. As explained above, capacitors 66 and 68 reduce clock feedthrough error of M1 and M2, and regulated cascode circuit 81 increases the output impedance of M2.

I claim:

1. A current cell comprising:

a constant current source feeding current into a summation node;

an input switching means for selectively coupling an input current to said summation node, said input switching means being effective for developing a summation current at said summation node substantially equal to a sum of said constant current source current and said input current;

an output switching means for selectively coupling said summation node to an output lead;

a current duplicator having an input electrode, an output electrode and a control electrode, said current duplicator being effective for establishing a current path between said input electrode and said output electrode in response to said control electrode, said control electrode being further effective for modulating said current path, said input electrode being coupled to receive said summation current, said output electrode being coupled to a reference ground;

a control switch for selectively coupling said control electrode to said input electrode, said switch being effective for inducing a control voltage at said control electrode when said control switch is closed, said control voltage being dependent on said summation current, said control switch further being effective for introducing an error voltage to said control voltage when said control switch is opened;

a first voltage storage means coupled between said control electrode and said reference ground, said first voltage storage means being effective for storing and maintaining said control voltage at said control electrode when said control switch is opened;

means for generating a modulation voltage at said input electrode in response to said control switch being opened, said modulation voltage being effective for compensating for said error voltage and maintaining said summation current at said input electrode substantially unchanged; and a second voltage storage means coupled between said input electrode and said reference ground, said second voltage storage means being effective for storing and maintaining said modulation voltage at said first input electrode, said input switching means decoupling said input current from said summation node in response to a respective sample-and-hold phase.

2. The current cell of claim 1 wherein said second voltage storage means includes a capacitor and an MOS transistor having a drain electrode, a source electrode and a control gate, said drain electrode being coupled to said summation node, said source electrode being coupled to said input electrode of said current duplicator, said capacitor being coupled between said control gate and said reference ground.

3. The current cell of claim 2 wherein said second voltage storage means further includes a second control switch selectively coupling said control gate to said summation node, said second control switch being controlled by another respective sample-and-hold phase.

4. The current cell of claim 2 wherein said capacitor is one of a physical capacitor and an intrinsic capacitance of said MOS transistor.

5. The current cell of claim 1 wherein said first voltage storage means includes a capacitor coupled between said control electrode and said reference ground.

6. The current cell of claim 1 wherein said current duplicator includes an MOS transistor having a drain electrode, a source electrode and a control gate, said drain electrode being coupled to said input electrode, said source electrode being coupled to said output electrode, and said control gate being responsive to said control electrode.

7. The current cell of claim 6 wherein said means for generating a modulation voltage includes a channel effect in said MOS transistor.

8. The current cell of claim 7 wherein said means for generating a modulation voltage modulates a transconductance gain of said MOS transistor.

9. The current cell of claim 1 wherein said control switch is an MOS transistor.

10. A current cell of the type having a first sample phase, second sample phase and a hold phase comprising:

a constant current source feeding current into a summation node;

an input current selectively applied to said summation node;

a first MOS transistor having a first drain electrode, first source electrode and a first control gate, said first control gate being effective for inducing an inversion channel having a transconductance gain and electrically coupling said first drain electrode to said first source electrode, said first drain electrode being coupled to receive a summation current substantially equal to a sum of said constant current source current and said input current;

a switch for selectively coupling said first control gate to said first drain electrode during said first sample phase and disconnecting said first control gate from said first drain electrode during said second sample phase, said switch further being effective for inducing a first gate voltage at said first control gate conducive to said transconductance gain and said summation current during said first sample phase and effective for introducing an error voltage to said first gate voltage during said second sample phase;

means for modulating said transconductance gain of said inversion channel so as to compensate for said error voltage and maintain said summation current substantially unchanged during said second sample phase, said means for modulating said transconductance gain further generating a compensation voltage at said first drain electrode; and means for memorizing and maintaining said compensation voltage at said first drain electrode during said hold phase, said input current being disconnected from said summation node in response to said hold phase.

11. The current cell of claim 10 wherein said means for modulating said transconductance gain of said inversion channel includes the induction of a channel effect in said first MOS transistor.

12. The current cell of claim 10 wherein said means for memorizing and maintaining said compensation voltage is in series between said summation node and said first drain electrode.

13. The current cell of claim 12 wherein said means for memorizing and maintaining said compensation voltage includes a second MOS transistor having a second drain electrode, a second source electrode and a second control gate, said second drain electrode being coupled to said summation node and said second source electrode being coupled to said first drain electrode.

14. The current cell of claim 13 wherein said means for memorizing and maintaining said compensation voltage further includes a second switch for selectively coupling said second control gate to said summation node.

15. The current cell of claim 14 wherein said means for memorizing and maintaining said compensation voltage further includes a capacitance coupled between said second control gate and reference ground.

16. The current cell of claim 15 wherein said capacitance is one of an intrinsic capacitance of said second MOS transistor and a physical capacitor.

17. The current cell of claim 14 wherein said means for memorizing and maintaining said compensation voltage further includes a cascode circuit coupled between said summation node and said second drain electrode.

18. The current cell of claim 17 wherein said cascode circuit is one of a simple cascode circuit and a regulated cascode circuit.

19. The current cell of claim 10 wherein said first MOS transistor includes a capacitance coupled between said first control gate and said first source electrode, said capacitance being effective for storing said first gate voltage.

20. The current cell of claim 19 wherein said capacitance is one of an intrinsic capacitance of said first MOS transistor and a physical capacitor.

21. A current cell characterized by a first sample phase, second sample phase and a hold phase comprising:

a constant current source feeding current into a summation node;

an input current selectively applied to said summation node;

a first MOS transistor having a first drain electrode, first source electrode and a first control gate, said first drain electrode being coupled to said summation node and receiving a summation current substantially equal to a sum of said constant current source current and said input current;

a first control switch selectively coupling said first control gate to said summation node;

a second MOS transistor having a second drain electrode, second source electrode and a second control gate, said second drain electrode being coupled to said first source electrode, said second source electrode being coupled to a reference ground; and a second control switch for selectively coupling said second control gate to said second drain electrode.

22. The current cell of of claim 21 further defined by a first capacitor coupled between said first control gate and said reference ground.

23. The current cell claim 22 further defined by a second capacitor coupled between said second control gate and said reference ground.

24. The current cell of claim 23 wherein said first and second capacitors are each one of an intrinsic capacitance of said first and second MOS transistors, respectively, and a physical capacitor.

25. The current cell of claim 24 further defined by a cascode circuit coupled between said summation node and said first drain electrode.

26. The current cell of claim 25 wherein said cascode circuit is one of a simple cascode circuit and a regulated cascode circuit.

27. The current cell of claim 25 wherein said first and second control switches are MOS transistors.

28. The current cell of claim 23 wherein said first control switch is closed during said first and second sample phases and is opened during said hold phase, said second control switch further being closed during said first sample phase and being opened during said second sample phase, said second control switch further being effective for inducing a gate voltage at said second control gate conducive to said summation current during said first sample phase and effective for introducing an error voltage to said gate voltage during said second sample phase.

29. The current cell of claim 28 wherein said summation current induces a channel effect in said second MOS transistor during said second sample phase, said channel effect being effective for modulating a transconductance gain of said second MOS transistor and inducing a modulation voltage at said second drain electrode, said modulation voltage being effective for compensating for said error voltage and maintaining said summation current unchanged.

30. The current cell of claim 29 wherein said first capacitor is effective for storing a measure of said modulation voltage.

31. The current cell of claim 29 wherein said second capacitor is effective for storing said gate voltage.

* * * * *

UNITED STATES PATENT AND TRADEMARK OFFICE
CERTIFICATE OF CORRECTION

PATENT NO. : 5,783,952
DATED : July 21, 1998
INVENTOR(S) : Jean-Jacques Kazazian It is certified that error appears in the above-identified patent and that said Letters Patent are hereby corrected as shown below:

Col. 3. line 66, "PMOS type" should read - - pMOS type - -.

Col. 3, line 66, "PMOS transistor" should read - - pMOS transistor - -.

Col. 9, line 66, "35" should be deleted.

Claim 28, col. 14, line 10, "further" should be deleted.

Signed and Sealed this

Sixth Day of October, 1998

*Attest:*

BRUCE LEHMAN

*Attesting Officer*  *Commissioner of Patents and Trademarks*